United States Patent [19]
Devilbiss et al.

[11] Patent Number: 5,336,325
[45] Date of Patent: Aug. 9, 1994

[54] ENHANCED VERTICAL THERMAL REACTOR SYSTEM

[75] Inventors: John J. Devilbiss, San Mateo; Steve Lugosi, Fremont; Robert G. Ozarski, Livermore, all of Calif.

[73] Assignee: ASM VT, Inc., Phoenix, Ariz.

[21] Appl. No.: 644,235

[22] Filed: Jan. 18, 1991

Related U.S. Application Data

[63] Continuation-in-part of Ser. No. 390,595, Aug. 7, 1989.

[51] Int. Cl.$^5$ .............................................. C23C 16/00
[52] U.S. Cl. ................................. 118/719; 219/390; 414/217; 118/725; 118/733
[58] Field of Search ............... 118/719, 725, 733; 414/217; 219/390

[56] References Cited

U.S. PATENT DOCUMENTS

| | | | |
|---|---|---|---|
| 3,805,736 | 4/1974 | Foehring | 118/719 |
| 4,576,830 | 3/1986 | Kiss | 118/719 |
| 4,593,644 | 6/1986 | Hanak | 118/719 |
| 4,640,223 | 2/1987 | Dozier | 118/730 |
| 4,767,251 | 8/1988 | Whang | 432/239 |
| 4,803,948 | 2/1989 | Nakagawa | 118/725 |
| 4,825,808 | 5/1989 | Takahashi | 118/725 |
| 4,926,793 | 5/1990 | Arima | 118/728 |
| 4,962,726 | 10/1990 | Matsushita | 118/715 |
| 5,058,526 | 10/1991 | Matsushita | 118/719 |

FOREIGN PATENT DOCUMENTS 161612 7/1988 Japan.

*Primary Examiner*—Richard Bueker
*Attorney, Agent, or Firm*—Quarles & Brady

[57] ABSTRACT

An enhanced vertical thermal reactor system provides three isolated chambers including a wafer handling chamber, a process chamber including an elevator, and a cool down chamber, each sealed from the other. The sealing of these individual chambers, each from the other, has the effect of minimizing processing delays associated with the cooling process and the loading and unloading process to thereby improve the productivity of the furnace. The process chamber includes non-metallic media such that it can be operated in oxidation systems so that corrosive acids will not affect the process chamber operation.

12 Claims, 13 Drawing Sheets

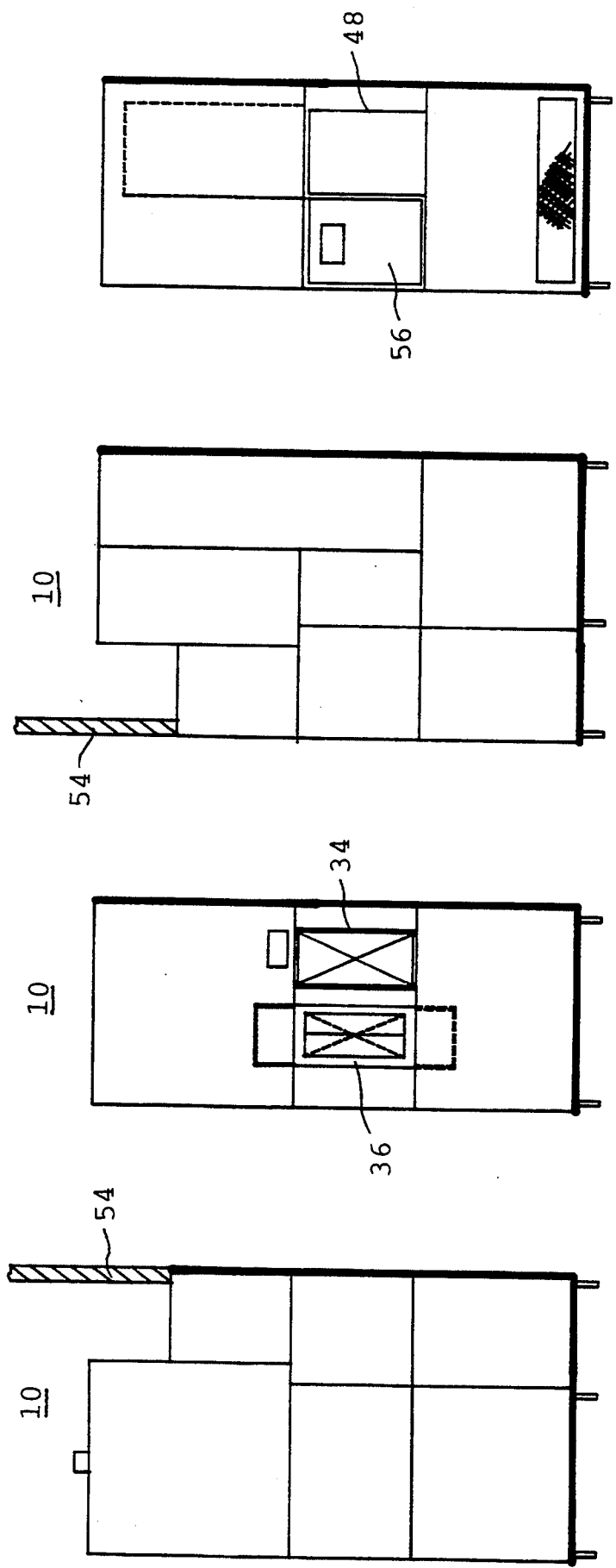

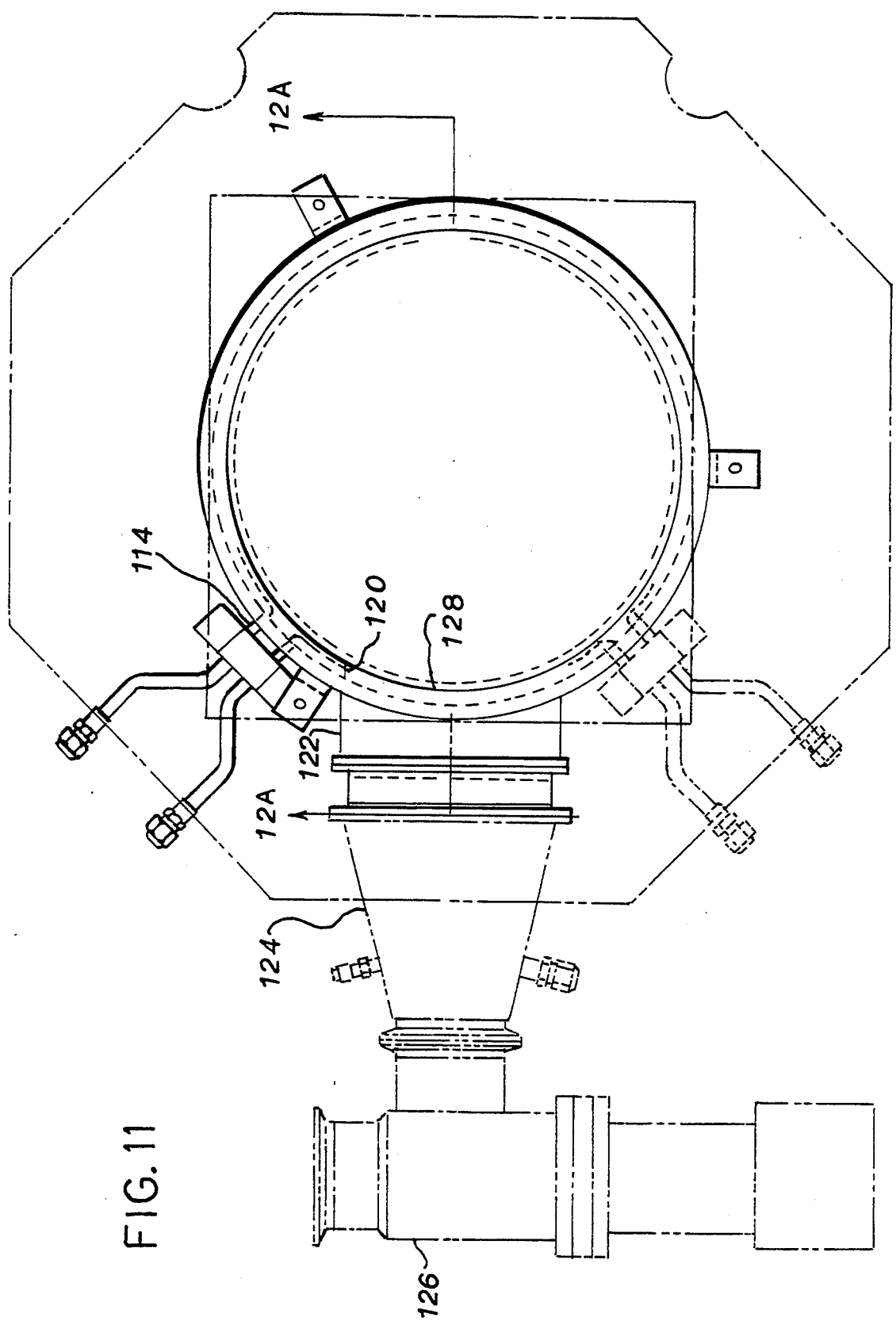

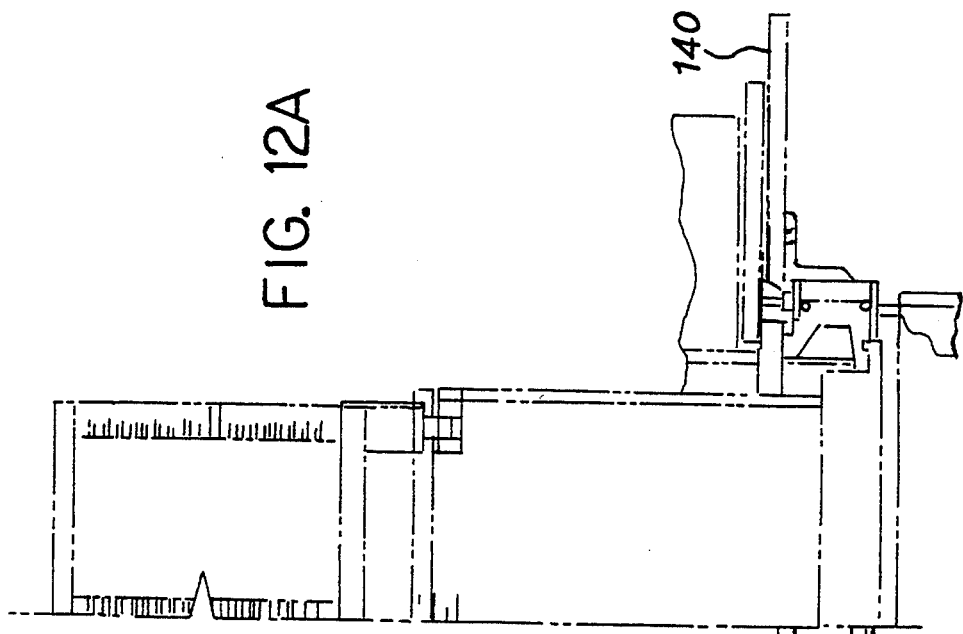
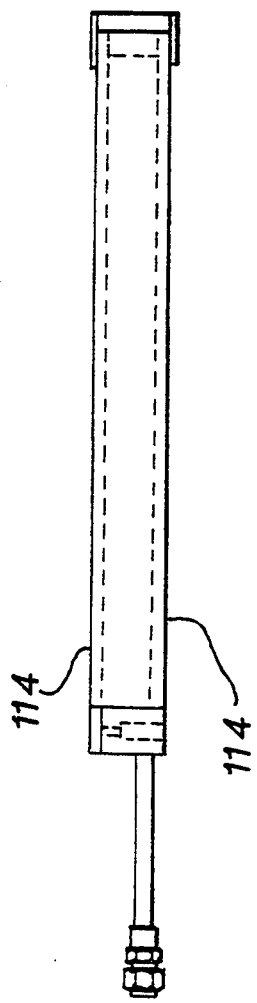

ENHANCED VERTICAL THERMAL REACTOR SYSTEM

CROSS REFERENCE TO RELATED APPLICATION

The present application is a continuation-in-part of co-pending patent application entitled "Enhanced Vertical Thermal Reactor," Ser. No. 390,595, filed Aug. 7, 1989, assigned to the same assignee as the present invention, the details of which are incorporated by reference.

BACKGROUND OF THE INVENTION

The present invention relates to an enhanced vertical thermal reactor (VTR) system for use in the processing of semiconductor wafers and the like. Vertical thermal reactors (furnaces) are known in the art which provide for the processing of semiconductor wafers.

In such type of VTR systems, semiconductor wafers contained within cassettes are loaded into a quartz boat and placed into the VTR for suitable processing. Problems in the processing of the semiconductor wafers include the fact that contamination can occur during various stages of the processing and processing delays can occur during the operation of the VTR.

One specific problem is that, particularly in oxidation systems, HCl is used for part of the process. TCA (tetrachloral actylene) may also be used. Both HCl and TCA, with the presence of moisture, form hydrochloric acid, which is extremely corrosive to virtually any metal.

There are other processes which use corrosive substances, such as POCL, and which form corrosive phosphoric acid compounds. The use of such corrosive substances can attack the metal within a process chamber, which can damage the chamber, but it can also release metal ions which find their way into the process, and therefore ruin the device's potential.

SUMMARY OF THE INVENTION

It is an object of the present invention to provide an enhanced vertical thermal reactor system for use in the processing of semiconductor wafers.

Briefly, the enhanced vertical thermal reactor system according to the present invention includes a number of chambers including a wafer handling chamber, a process chamber and a cool down chamber wherein the process chamber comprises non-metallic media such that it can be utilized in oxidation systems wherein, for example, a hydrochloric acid will not affect the process chamber operation.

Other objects, features and advantages of the present invention will become apparent from the following detailed description when taken in conjunction with the accompanying drawings.

BRIEF DESCRIPTION OF THE DRAWINGS

The accompanying drawings which are incorporated in and form a part of this specification illustrate an embodiment of the invention and, together with the description, serve to explain the principles of the invention.

FIGS. 9A-D depict an EVTR elevation schemes.

FIG. 11 depicts a view of a non-metallic atmospheric exhaust assembly as utilized with the present invention.

FIGS. 12A-B depict other views of the assembly of FIG. 11.

DETAILED DESCRIPTION OF THE DRAWINGS

Reference will now be made in detail to the preferred embodiment of the invention, an example of which is illustrated in the accompanying drawings. While the invention will be described in conjunction with the preferred embodiment, it will be understood that it is not intended to limit the invention to that embodiment. On the contrary, it is intended to cover alternatives, modifications and equivalents as may be included within the spirit and scope of the invention as defined by the appended claims.

Before going into detail with the respect to the aspects of the present invention, the details of the co-pending application identified above will now be described to provide a general overview.

Figure 1:
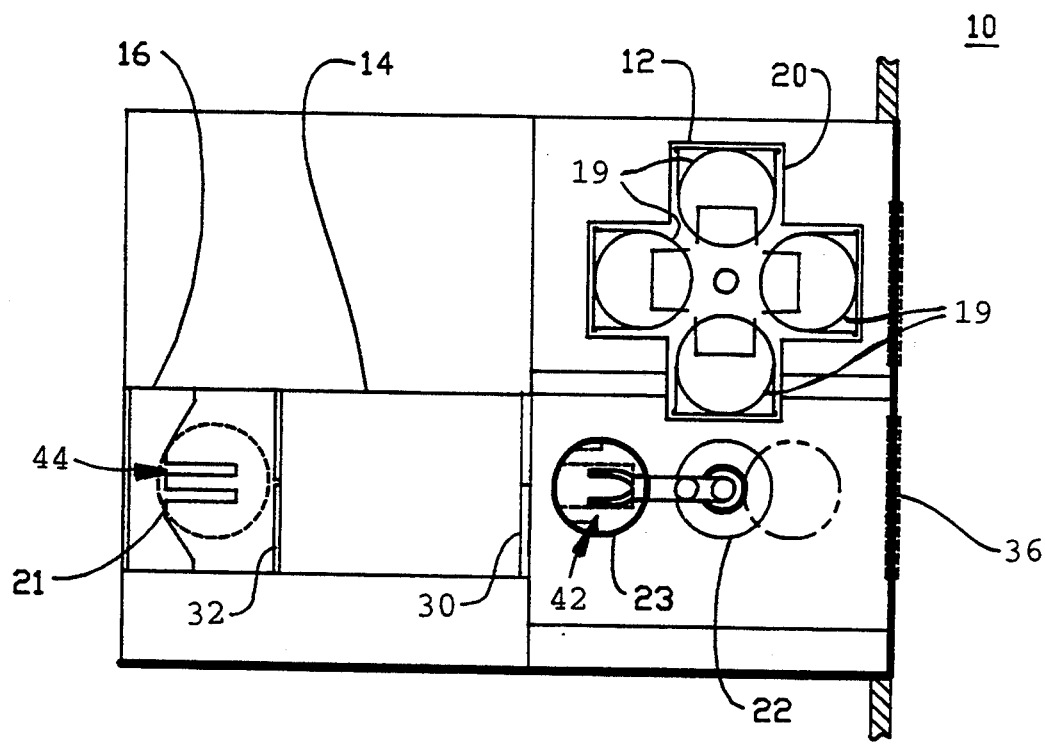
FIG. 1 depicts a plan view of an enhanced vertical thermal reactor system.

Referring now to FIG. 1, the plan view of an enhanced vertical thermal reactor (EVTR) shows three areas or stations. There is a front area called the wafer handling area 12. There is the center area beneath the process tube called the process area 14. There is an area behind that which is called the cool-down area, or cool-down chamber 16. In the wafer handling area 12, there are three major components. There is the cassette carousel 20 which stages twelve cassettes 19 of wafers all the way up to eight inches. There is also a polar coordinate robot 22 and a front shuttle 42.

In the process area or chamber 14, there are isolation doors 30 separating it from the wafer handling area 12 and isolation doors 32 separating it from the cool-down area 16. A boat door 38 of the process tube travels up and down within that process area 14.

In that area 14, wafers are brought in and moved up into the process tube so there is no activity other than that wafers are moving in and out of that region. In the cool-down area 16, there is a separate shuttle 44 which is able to move into the process area to take out completed loads of wafers and take them back into the rear of the system for cooling. Each of the chambers 12, 14, and 16 has horizontal laminar flow across it. The entire wall of the system 10 includes a HEPA filter, which is known filter in the art. There are internal blowers which drive air on the order of 100 linear feet per minute across those chambers to a return plenum and the return plenum allows air to recirculate so the air can run around continuously and which helps get it cleaner as it recirculates through.

The wafer handling area 12 has a completely separate air handling system so that it has its own filter, plenums and blower. The process chamber 14 or (process area) and the cool-down chamber 16 share the same blower.

They have separate filters on their walls, but that area is co-mingled through the blower that services those two chambers. Both of those areas have separate nitrogen systems which allow a nitrogen flow (or other suitable flow, such as argon) that can purge those areas at a high flow rate. While doing a high flow purge, the exhaust is opened through a diverter which allows the entering nitrogen to force air out through the system exhaust. After a period of time, the flow rate is dropped down from a high flow to a low flow and then the low flow finishes clearing out the oxygen. At that time the diverter is closed and the system 10 recirculates the nitrogen, but continues the low flow to make up for leaks that may be in that portion of the system.

There is a separate purge circuit for the wafer handling area 12 and there is a separate circuit which purges both the process area and the cool-down area so there are two circuits. It should be noted that it is possible to separately purge the cool-down area 16. Those chambers can have a monitor to monitor the oxygen level so that the flow of wafers can be controlled throughout the system such that they do not move from one chamber to the next or into the process tube unless a specified partial pressure of oxygen is reached. The specified pressure could be 200 parts per million; for others, it could be ten parts per million or less.

Figures 2A, 2B:
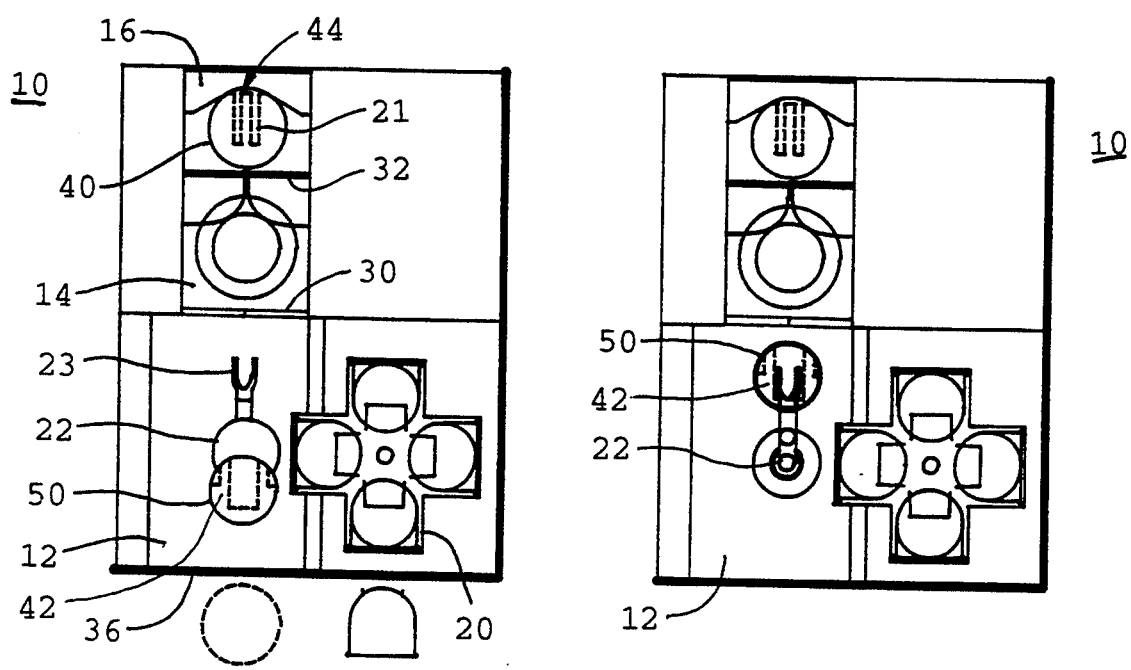
FIGS. 2A-H depict a diagram illustrating the operation of the system of FIG. 1.

FIGS. 2A-2H show in schematic fashion the flow of material through a system 10 from a so-called cold start up. It is a system that has never been run before and therefore it has no quartz ware in it. The first thing to do is put in a boat 40 (FIG. 2A). The front shuttle 42 in the wafer handling area 12 is able to move over the top of the polar coordinate robot 22 to a boat loading door 36 at the front of the system 10. That door 36 is opened and a clean boat 40 can be put into the system from the clean room side. This is a feature considered important because it does allow quartz ware to get into the system very easily.

A clean boat 40 is then placed into the system 10 and that clean boat 40 is moved to the rear of the system because it is desired to get two boats into the system. The clean boat 40 is placed onto the front shuttle 42. It then gets shuttled to the rear of the wafer handling area 12. This is accomplished by the front shuttle 42 extending through the front set of isolation doors 30 and cantilevering into the process area 14. Then the rear isolation doors 32 open and the rear shuttle 44 moves forward into the process area 14 until the fingers 21 and 23 of the two shuttles interdigitate, as is shown in FIG. 1. This allows the two shuttles 42, 44 to come together inside the process area and the front shuttle 42 which has both vertical and horizontal movement can drop down slightly, transferring the boat 40 to the rear shuttle 44 and then the rear shuttle 44 is backed out taking it into the cool-down area 16. The front shuttle 42 then moves forward, and the isolation doors 30, 32 are closed.

Figure 2C:
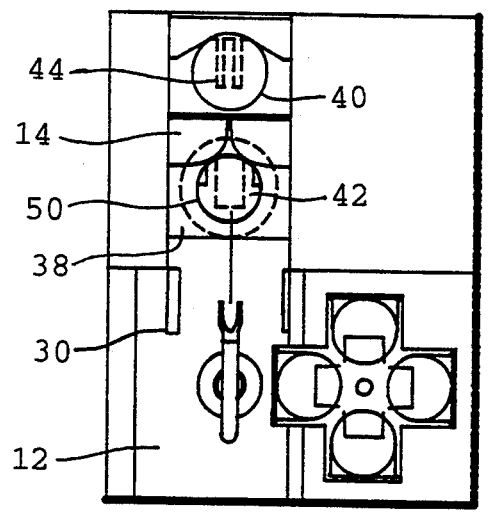

Now, a second boat 50 can be placed on the front shuttle 42 which is again moved all the way to the front of the system 10. The second boat 50 is then moved towards the rear of the wafer handling area 12 to the load position (FIG. 2B). Then the polar coordinate robot 22 begins taking wafers from the cassette carrousel 20 and putting the wafers into the slots of the boat 50. When the robot 22 then completes loading that boat 50, the front isolation doors 30 open and the front shuttle 42 transfers the boat 50 into the process chamber 14 (FIG. 2C). Previously, the load door 38 of the process chamber 14 has been brought down to its low position and the shuttle 42 reaches in over the top of the load door which has resting on it a quartz plug and then the boat 50 is set down onto the top of that quartz plug and 42 drawn back to the wafer handling area 12.

Figure 2D:
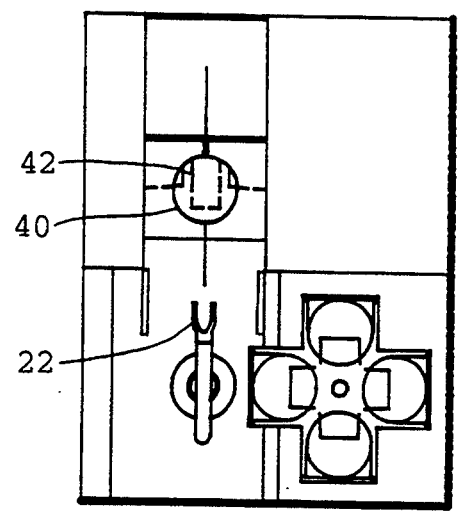
Figure 2E:
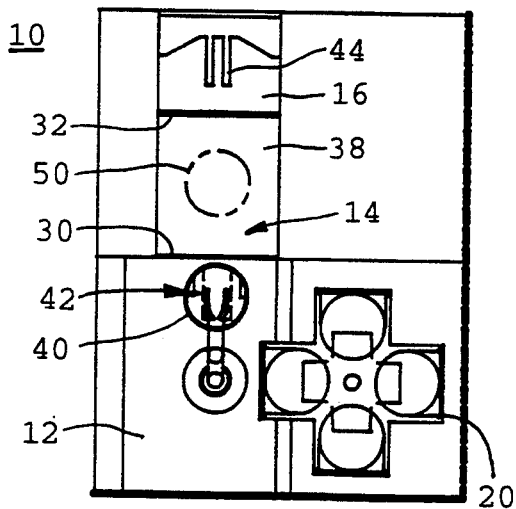
Figure 2F:
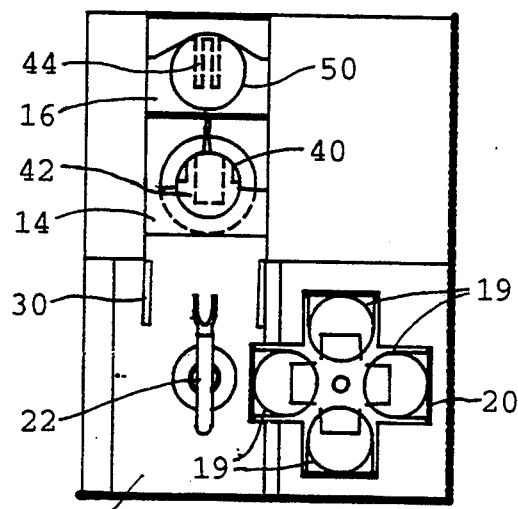
Figure 2G:
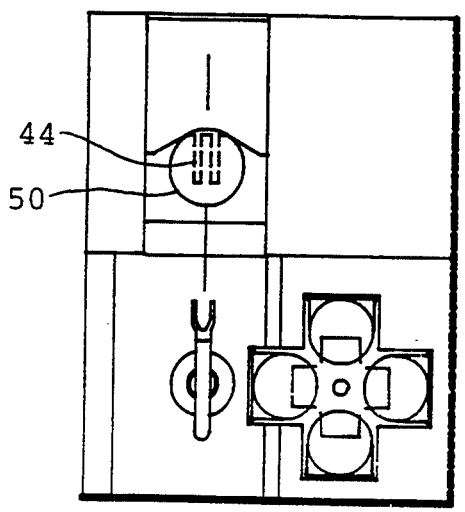
Figure 2H:
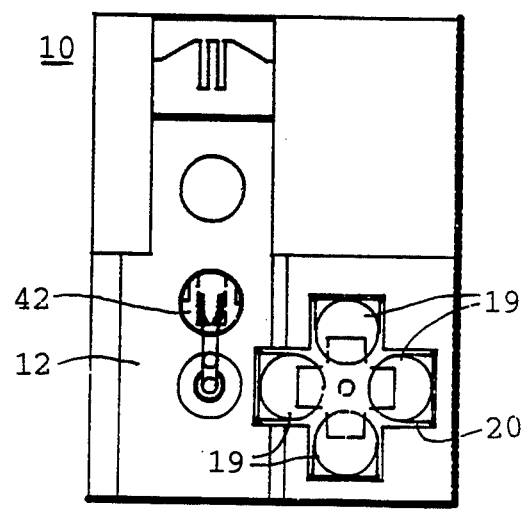
Figure 7:
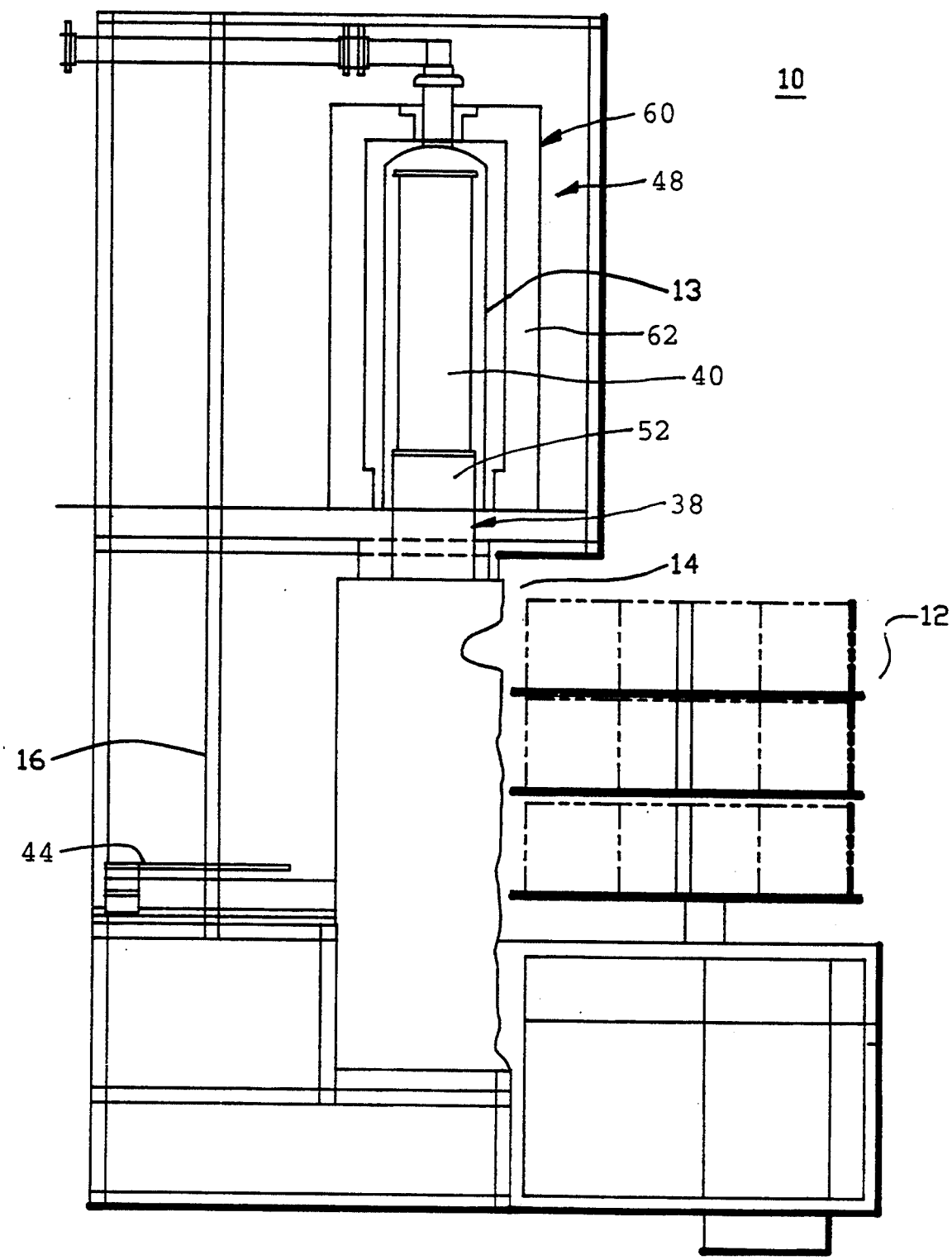
FIG. 7 depicts a side view of isolated and independently purged stations.

Now, the load door can push the load up into the furnace 48 (see also FIG. 7). When that load moves all the way up into the furnace, then the boat 40 which had been previously placed in the cool-down chamber 16 is transferred to the front. The transfer is accomplished by the two shuttles 42, 44 coming together and then the front shuttle 42 lifts up slightly to carry the boat 40 and withdraw the boat into the wafer handling area 12 (FIGS. 2D and 2E). The isolation doors 30, 32 are closed again and the second boat is now loaded full of wafers from the cassette carrousel 20 (a boat typically has 130 slots).

At this point, the second boat 50 presumably has completed processing either during or after the time that the boat 40 was transferred forward and just completed loading. The boat 50 then is lowered down into the bottom portion of the process area 14 (FIG. 2E). The rear shuttle 44 comes into the process area 14 and slips between the plug and the process boat (the process boat stands on legs on top of the plug allowing the rear shuttle 44 to slip in between). When that shuttle 44 gets underneath, the load door 38 lowers slightly more transferring the weight to the rear shuttle 44 and then the rear shuttle 44 withdraws into the cool-down area 16. The rear isolation doors 32 are closed again.

The front isolation doors 30 are opened (FIG. 2F) and the boat that was just loaded now moves over the top of the load door and is transferred to the load door, the shuttle withdraws, and the load door then goes up moving the second batch into the process chamber 14. As soon as the boat 50 which has been cooling in the cool-down chamber 16 has reached a temperature where the wafers can be handled, it is transferred by the two shuttles 42, 44 coming together again (FIG. 2G) and is passed from the rear shuttle 44 to the front shuttle 42. Boat 50 is taken into the wafer handling area 12, where it is unloaded into the cassettes 19 (FIG. 2H) and now this boat 50 is reloaded with fresh wafers to be processed. Then the cycle continues to repeat, which allows for continuous processing.

Figure 3:
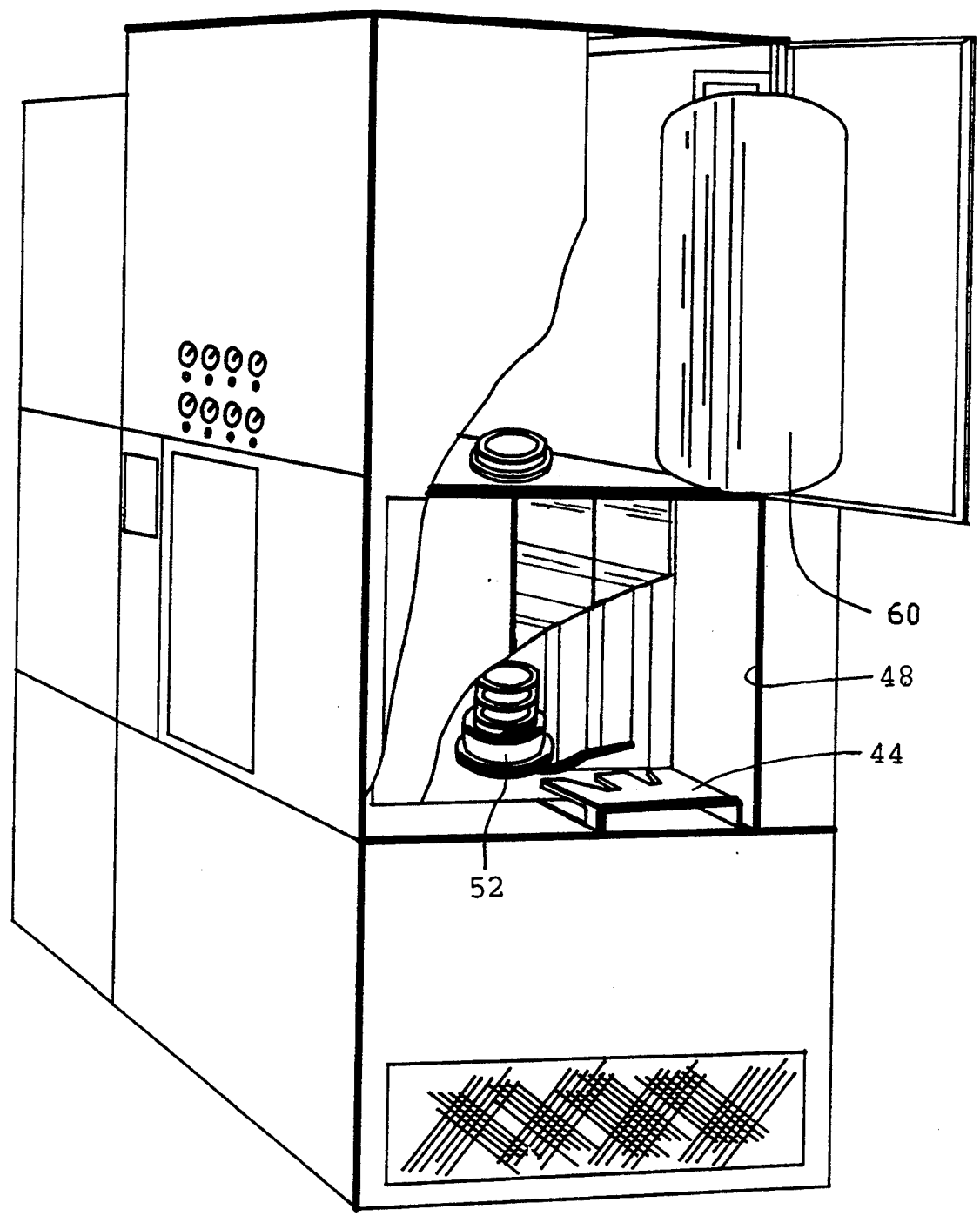
FIG. 3 depicts a rear access view of the system of FIG. 1.

In FIG. 3, a rear view of the system 10 is shown. In that view, the element 60 of the system 10 can be seen which consists of the heater 62 and the process tube 13 shown swung out at the top of the system 10 (see also FIG. 7). This illustrates the element removal system which allows one to easily replace quartz process tubes after cleaning. The function is such that the entire element is setting on in its normal processing condition; a pneumatic system lifts up the process element 60 into about an inch. It is then rolled towards the rear of the system on suitable rails, such as Thompson brand rails and when it reaches the end of its rolling travel it then swings out such that it is outside the frame of the system, cantilevered out over the system (the quartz tube is inside the element).

When it is swung outside the system 10, the pneumatic system then lowers that entire element 60 down to a cart or table where the quartz tube 64 is released from the flange that holds it inside the element 60 and its bolts are loosened and the flange removed which allows the quartz process tube 13 to come out of the element 60. The quartz process tube 13 can be resting on the cart or table and the element 60 is lifted up by the pneumatic system leaving behind the process tube 13 so it can then be rolled out and a new process tube rolled underneath the element, lowered down again, the screws fastened and lifted up into the system and then rolled into the system so the entire exchange can be done on the order of ten minutes.

In order to connect and disconnect the element 60, depends on which process is being used (whether it is a low pressure system or an atmospheric system).

If it is a low pressure system, there is a short section of vacuum line which has to be removed before the element can be pulled out and three heater lines have to be disconnected as well as the thermocouples. The tube connections have to be broken and short sections of active line have to moved, but the entire element comes out.

If it is an LP system, the vacuum connection which goes up to the ball joint on the top of the tube remains in place, so a large section of vacuum tube comes out with the element and when the element is lowered down then that back connection is broken. This means that it is not necessary to climb up over the top of the system to release the back connection from the ball joint. It can be done after it is lowered down to the level for servicing. If it is an atmospheric system, there is no vacuum connection there but the eject lines do have to be disconnected (they are on flexible tubing). Similarly, this system is brought out, lowered down, and then the connection at the top can be broken for the eject line.

One other thing that can be seen from the back in FIG. 3 is that there is a door 48 in the center or on one side of the back which aligns with the rear shuttle 44. When a boat, plug or other quartz item becomes contaminated, it can be readily removed from the system by the rear shuttle 44 picking up the item and bringing it to the rear door 48 through which the contaminated item is removed. Both the boat and the plug 52 can be brought to this rear station for removal.

Figure 5:
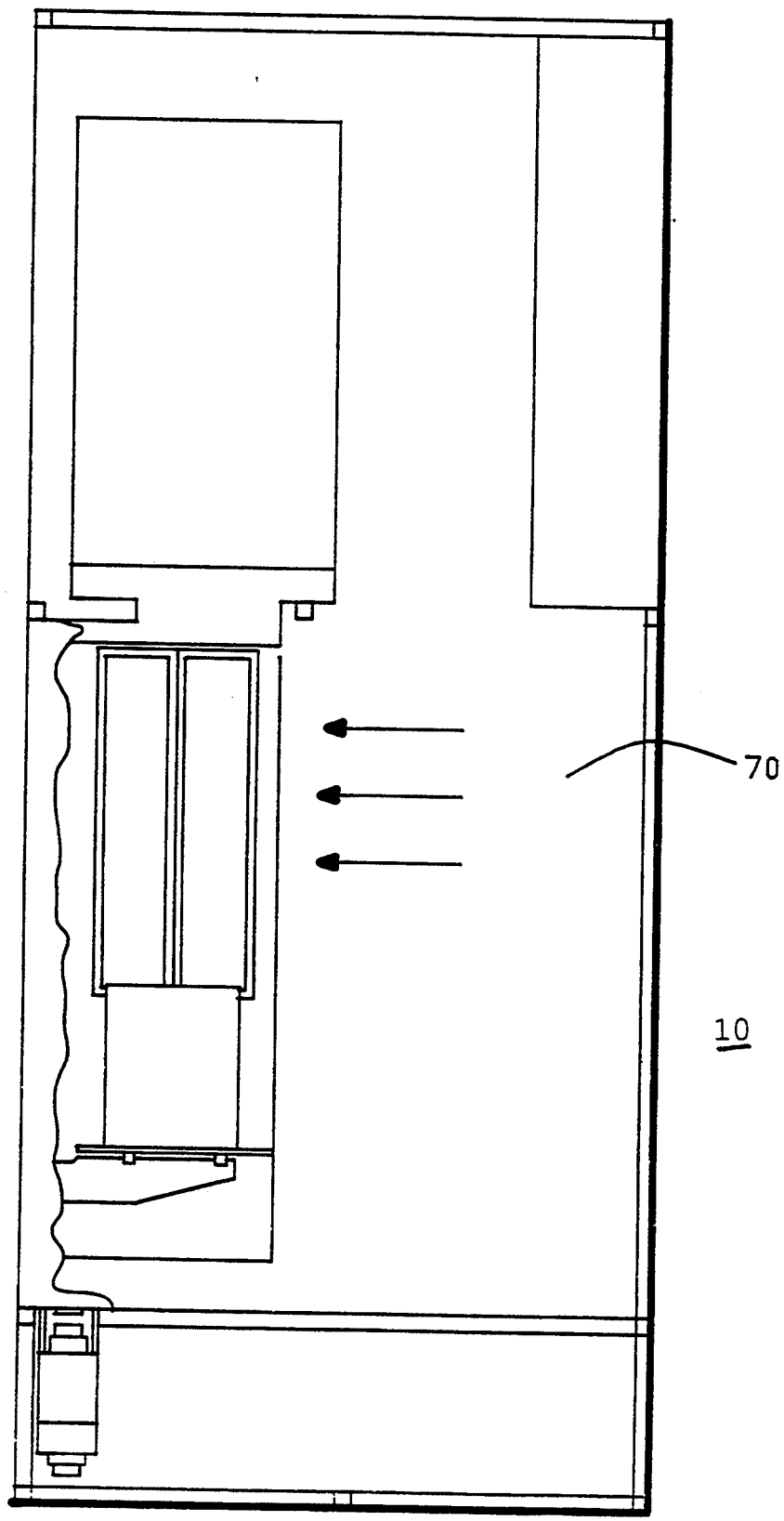
FIG. 5 depicts a front view.

One major problem is removal of sources of particulates and removal of particulates from areas in which the wafers may be exposed. The laminar flow 70 within the system 10 shown in FIG. 5 provides clean room type flows which carry away any particles. To further aid in the removal and prevention of particles reaching the wafers, all the mechanisms within the system are isolated in some way. For example, in FIG. 5 (front view), the elevator mechanism which lifts the load door and the process boat into the process chamber is in the exhaust mechanism (in the exhaust plenum). The motor is also below the system such that laminar flow air travels from the clean filter across the wafers into the return duct. The mechanisms are within that return duct so that any particles that might be generated there by the mechanical motion are swept away from the wafers and carried back to the filters where they can be swept out.

Figure 6:
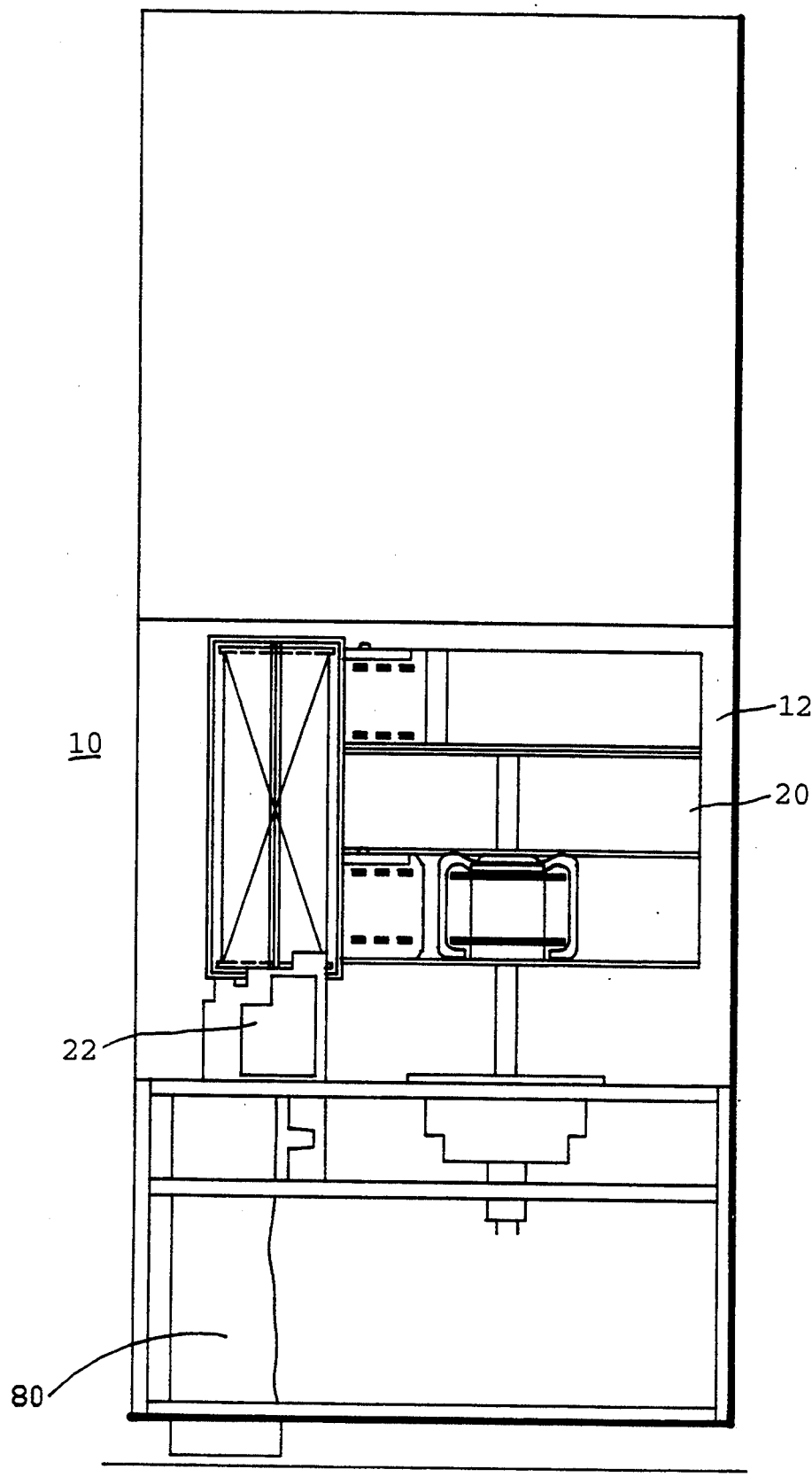
FIG. 6 depicts moving mechanism below wafers in separately exhausted compartments.

In FIG. 6 the moving mechanism 80 for the robot 22 and the carrousel 20 are both beneath the floor of the wafer handling area 12 of FIG. 1. The upper portion where the wafers are has a laminar flow travelling from the robot side towards the carrousel side (where the return plenum is). The drive mechanism for the robot 22 and the drive mechanism for the carrousel 20 are below the plate which supports the carrousel. Those mechanisms are in a separate exhaust area so that any particulates that are generated by those two mechanisms are drawn away from the wafer handling area 12 and exhausted separately.

FIG. 6 shows the silhouettes of the robot and the motor drive for the carrousel which are below the load plane.

FIG. 7 shows in profile a side view in which the three areas of the system can be seen. The wafer handling area 12 (which is at the right-most side of FIG. 7) is shown without the laminar flow section which resides over the top of the carrousel. The process tube 13 is shown in silhouette with a boat 40 and a plug 52 in it and the element insulation and heater coils surrounding it. This is shown as an LP system so the vacuum is coming out through the top of the system 10. On the left-most side is the cool-down chamber 16 showing its shuttle 44 in profile. As can be seen, the center of process area 14 is much deeper than the other two areas 12, 16 which allow the load door 38 to come down to a level such that a process boat 40 can be set on top of the plug 52.

There are two fundamentally different types of boats that are used in these systems. For certain processes there is a certain type of boat called a cage boat. In a cage boat, a cylindrical quartz tube surrounds what might be the conventional boat. That cylindrical boat is split in half and must be opened up for wafers to be loaded.

The present system has a cage boat removal or opening mechanism. When the boat with a surrounding cage is moved into the wafer handling area 12, an arm pivots underneath the front half of the cage and then lifts up. As the arm connects with the cage, it pivots to open the boat so that wafers can be loaded into or unloaded from the cage boat.

Figure 4:
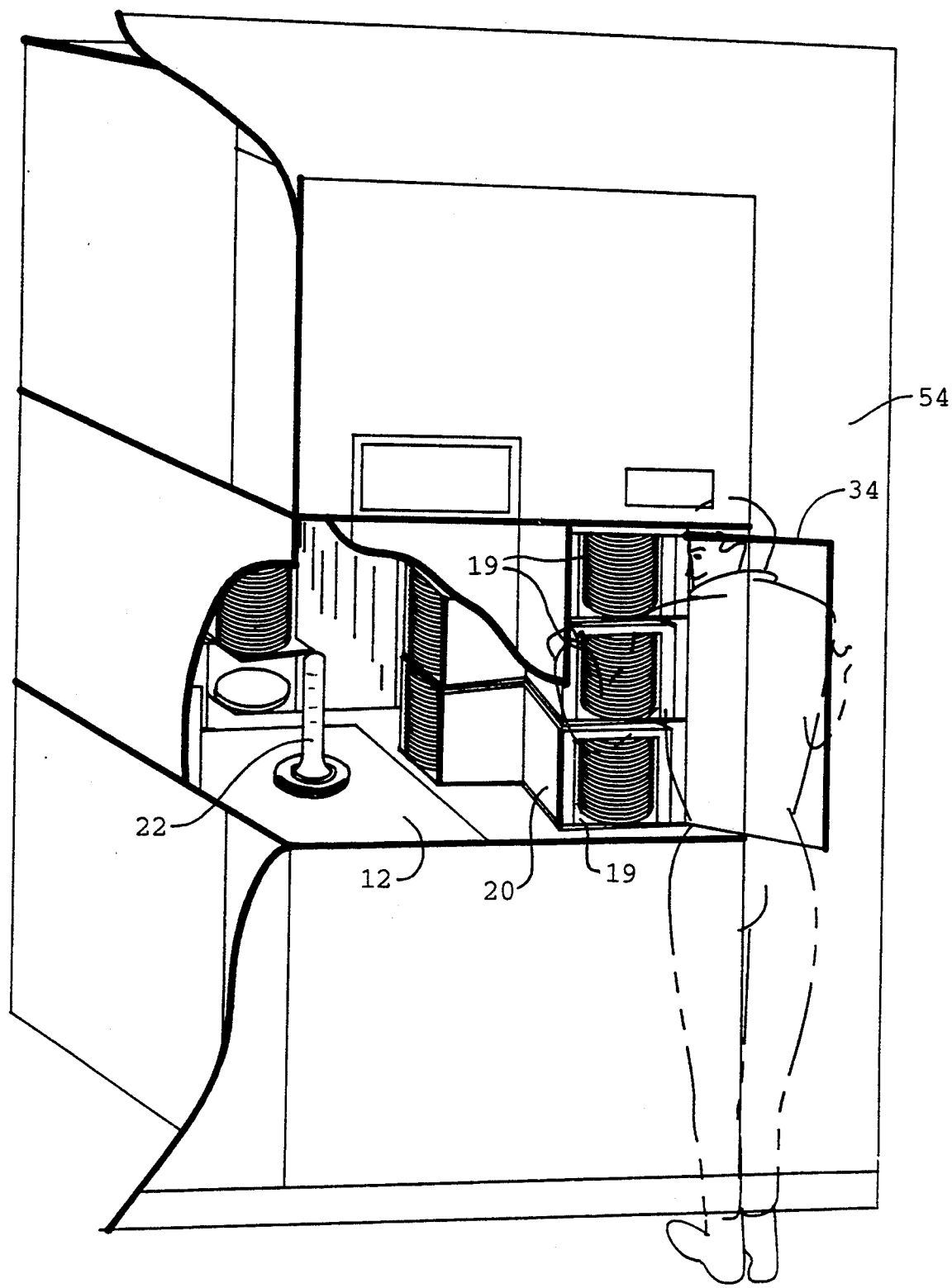
FIG. 4 depicts a wafer handler view.

When the system is normally mounted as seen as in FIG. 4 such that the front is flush with the clean room wall 54, a laminar flow hood can be added over the front of the system. Then what is normally the front is moved back approximately 18 inches and a shelved laminar hood is added in front of the system to allow a place for the staging of cassette carriers so that the cassette carrier can be set in this laminar flow at the front of the system on a shelf at the front and opened for insertion into the carrousel 20.

As can be seen in FIG. 4 the carrousel 20 presents three cassettes 19 at a time to the front of the system, so when the door 34 is open the operator is then prompted to load or unload one of the three cassettes that are presented.

In FIG. 4 a right handed system is seen. A right handed system is defined by the side into which cassettes are loaded. Mirror image systems can also be provided and access is required only from one side of the system and the rear. Therefore, with mirror image systems two systems can be butted side by side reducing the amount of room needed for installation and operation. At the front of the system there is a touch screen which uses an electroluminescent display from which all functions of the system are controlled, including the process recipe and the system recipe which the sequencing of loads, unloads and purging cycle are determined. The purge cycles are completely programmable from that front panel to allow any of the separately purged chambers to be purged at the time and to the level specified at that front touch control panel.

Figure 8:
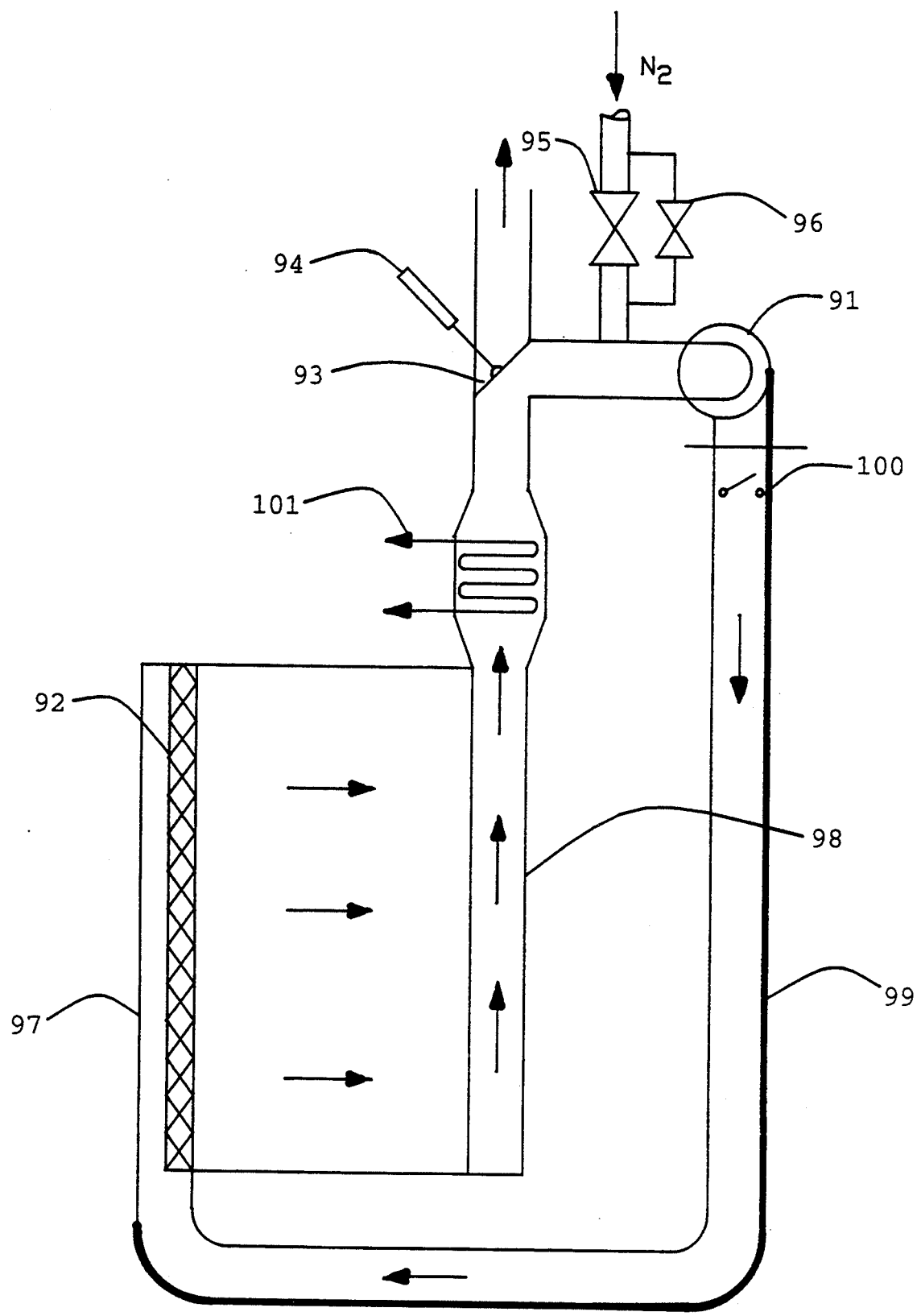
FIG. 8 depicts a diagram of a purge system.

FIG. 8 (labeled EVTR purge systems scheme) schematically illustrates the laminar flow and the purge system. The elements are described and numbered there. The chambers are two separate circuits and are very similar in function with the exception that the circuit which includes the process chamber has a heat exchanger 101.

In FIG. 8, the EVTR purge system can be designed with two purge systems. One is for wafer handling module purge system, the other is for the furnace module purge system. The two purge systems are similar in concept but different in geometries.

Both purge systems have to provide five PPM oxygen levels and maintain at least 80 linear feet per minute laminar flow in the designated envelopes. The direction of the laminar flow in both purge systems must be the same.

Both purge systems include the following components as depicted in FIG. 8. These components include a blower 91, VLSI grade filter 92, flow diverter 93, diverter actuator 94, main flow valve 95, bypass flow valve 96, entrance plenum 97, exit plenum 98, ducting 99, and a flow sensor 100. The materials used in the design of a purge system must be Class 1 clean room compatible. The purge system to be sealed must withstand a water pressure differential of two. The purge system heat load is regulated by boat withdrawal rate. The design allows recirculation of the purge gas.

When the process load comes down, there is a large amount of heat radiated that has to be carried away from the system. That heat exchanger 101 (which is a water cooled heat exchanger) removes the heat which otherwise would be carried away by exhausted air. Since this system has the capability of recirculation nitrogen or air, the air or the nitrogen that is being recirculated must be cooled. The heat exchanger 101 provides that capability. Item 93 illustrates the diverter valve which allows the flow to be either recirculated or exhausted from the system.

FIGS. 9A–D show the elevations of the EVTR system 10. The left-most side (FIG. 9A), is a non-access side with a number of panels which are bolted in place, as access to the system normally is not required from this side. In looking at the profile of the system, it can be seen that the height of the system at the clean room wall 54 is lower than farther from the wall, in the maintenance or chase area. The penetration through the wall 54 is 104 inches high and the system has a four inch clearance underneath it to allow for those clean rooms which require flow underneath the systems.

Moving toward the rear of the system, the height is 115 inches including the four inch access underneath the system. There is nothing of the system which comes above that 115 inches. The gas lines must come in from the top into the gas tray and the furnace air exhaust and inlets also come in through the top for the connections made from the housing facilities above the system.

In FIG. 9B, the front clean room side view shows the width of the system (which is approximately 46 inches wide and has its frame and with its cosmetic panels in place is approximately 48 inches). There can be seen the two doors 34 and 36 which are in front of the system. Here a right-hand system is illustrated and there is a cassette load door 34 which swings out and in that view can be seen where the cassettes would normally go in.

There is a left-handed door 36 where clean boats are normally brought into the system. The illustration of the access side (FIG. 9C) shows the gas panel in the system. The right-most illustration (FIG. 9D) shows the rear with the boat removal access door 48 on the right-hand side. On the left-hand side there is the power distribution box 56. In there can be seen a square which illustrates where a control panel can be mounted such that the controlling system can be from either the rear or from the front. It can only be from one end at a time so a switch selects either the front control panel or the rear control panel. There can also be a remote panel on a card.

Figure 13A:
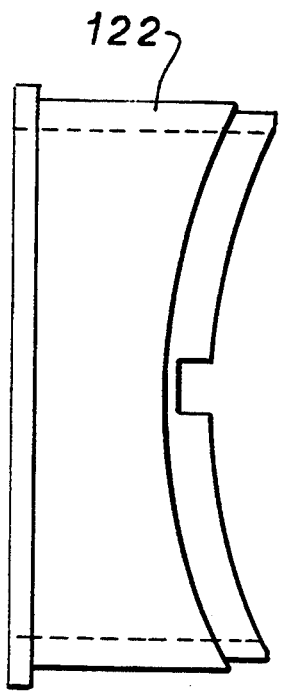
FIGS. 13A-C depict views of an exhaust tube as utilized with the present invention.
Figure 13B:
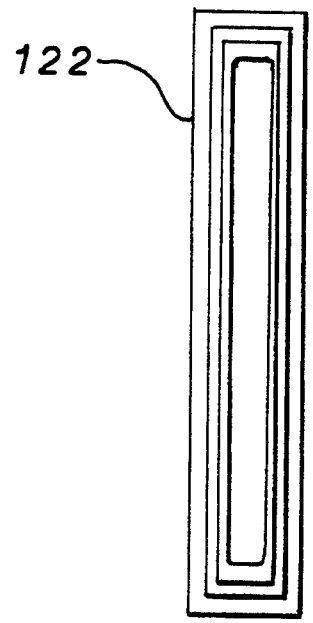
Figure 13C:
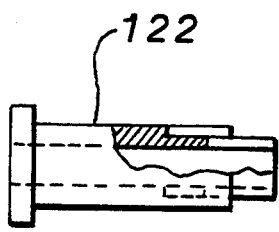

Now that the EVTR system of FIGS. 1–9 has been described, improved aspects of the present invention will now be described in conjunction with FIGS. 10A–D to 13, in which FIG. 10A–D depicts views of an atmospheric cooling ring as utilized with the present invention; FIG. 11 depicts a view of a non-metallic atmospheric exhaust assembly as utilized with the present invention; FIG. 12A–B depicts another view of the assembly of FIG. 11; and FIG. 13A–C depicts a view of an exhaust tube as utilized with the present invention.

In one design, the process tube is all quartz, but the load door (or elevator) is stainless steel. In the nominal case, for corrosive applications, Hastalloy is used, which is much more resistant to the acidic attack than stainless steel (but still corrosive).

In applications which are very high density, such as a 16 Megabyte memory and a 64 Megabyte memory, there is a major concern, because there can be many process steps before the devices on the wafer are found to be contaminated.

The present invention uses silicon carbide and quartz such that the process chamber is completely sealed and there is no exposure to metal inside the process tube. The use of silicon carbide and quartz is carried further through the exhaust (scavenger) of the system.

At that point, it goes out past the valve, which is Teflon coated, so that there is no exposed surface up to the distance. Finally, at the outlets of the exhaust valve, it goes to stainless steel tube. That could also be non-metallic, if later there is a corrosion problem.

The temperature comes down as the gas becomes diluted, and the gas is less corrosive. So, at the exhaust valve, there is a provision there to introduce nitrogen to dilute the process gases further, both cooling and diluting so that it will be that much less corrosive.

The exhaust system becomes non-metallic at that point, quartz is used because it is less expensive to work with than silicon carbide, and because that environment is non-stressful, whereas the high temperature inside a process tube is stressful.

There are thermal and structural problems that are non-trivial. One key aspect is to seal the tube. Horizontal tubes use a non-sealing door on the system. They surround that with a very large chamber which scavenges leaking gases, so it is not a hard seal.

The present invention provides a hard seal, an O-ring seal, which has to be kept cool, whereas in a horizontal tube there is not a hard seal. Prior approaches have used a quartz door, which does not give a good seal, requiring a scavenger for leaking gases. On a vertical tube, there is no room for a large scavenger because of the height restrictions on the system.

With a hard seal, there is no need to scavenge, but then that hard seal has to stay below about 250° C. Therefore, it is necessary to provide cooling water jackets.

Another constraint is that since the load door carries the load of wafers (which with the quartz boat is about 80 pounds), it must be structurally strong. Some user specifications require that door to be able to handle five times the nominal load. If a quartz door was used, there is a potential structural problem. Quartz is a weak medium to be supporting the load. It is very brittle and a shock load could break it.

Another aspect is that it is necessary to keep the O-ring cool, and that cannot be done very easily with quartz.

At the bottom of the process tube there is a non-metallic (silicon carbide) ring which has a water jacket attached to it. There are several key features regarding that non-metallic ring.

In a conventional metallic design, exhaust gas is drawn through the center of the insulation plug through a hole in the center of the door, and then out an exhaust manifold that is attached to the bottom of the door. The exhaust then vents out towards the side edge of the door, where there is a gap. On the other side of the gap, the exhaust system draws the gas.

During the normal process, the processed gas goes down the process tube 13, and around the sides of that tube. The gas then enters the exhaust plenum at the plug 52 near the bottom of the process tube 13, and is drawn out through the center hole.

One of the key aspects of the present invention is that it is desirable to keep the flow pattern as much the same as possible, because that flow pattern gives great uniformity. But it is necessary to make a hard connection for the exhaust. The exhaust cannot be put on the load door anymore, so now the exhaust is above the load door in the silicon carbide ring 110 (the annular ring), which can be seen in FIG. 11.

Figure 10B:
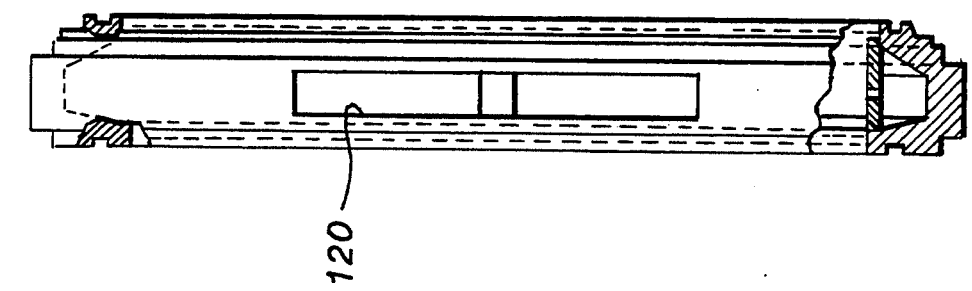
FIGS. 10A-D depict views of an atmospheric cooling ring as utilized with the present invention.
Figure 10A:
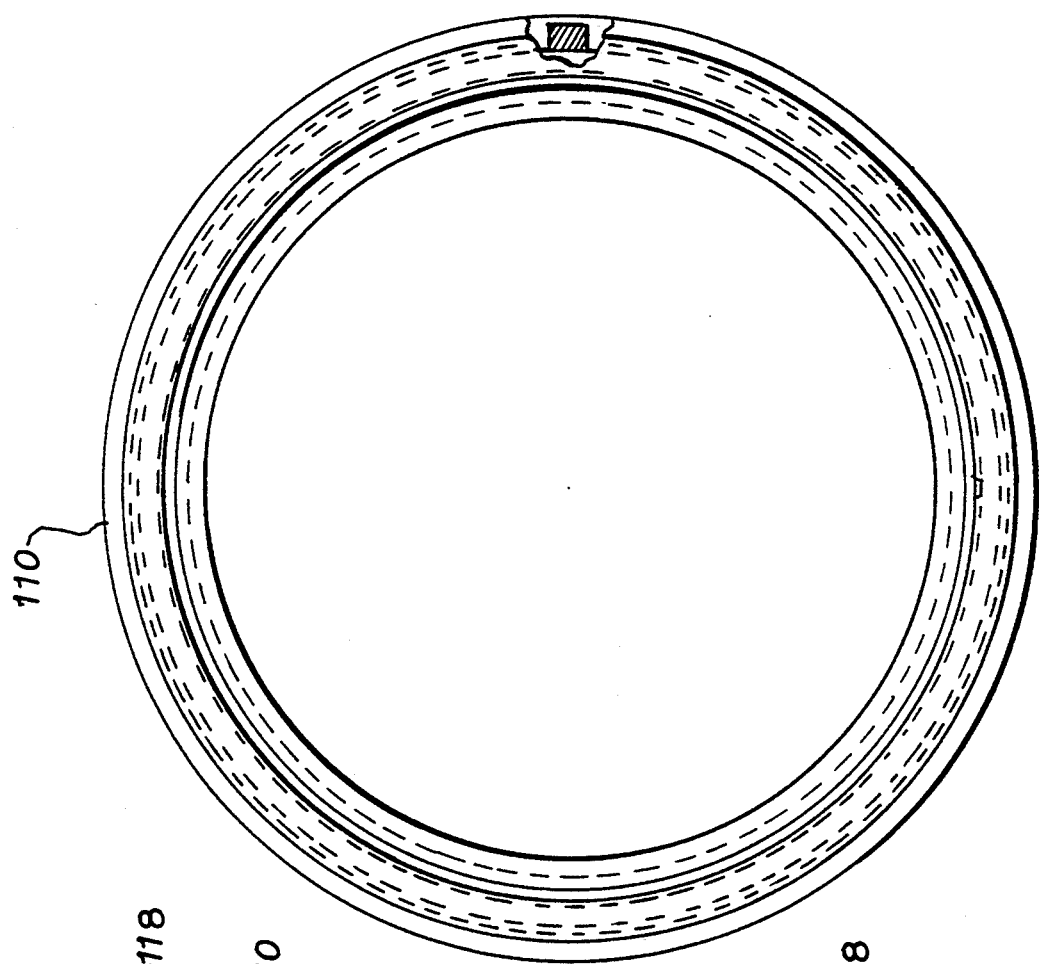
Figure 10C:
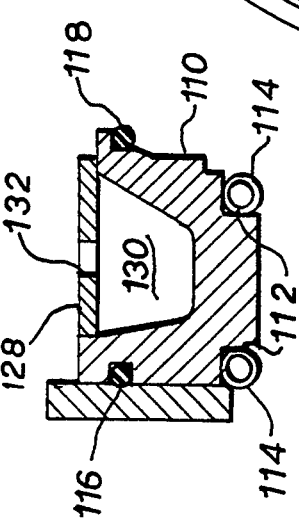

FIG. 10C shows the silicon carbide ring 110, which in cross section has a V shape with two channels 112, in which a water jacket 114 is wrapped.

At the top edge and the bottom edge of ring 110, there is a separate O-ring 116 and 118 (FIG. 10C) to keep cool. That is why the water jacket 114 is attached to the silicon carbide ring 110. It is necessary to conduct heat away from those O-rings 116 and 118 to keep them below 250° C. Otherwise the O-rings will reach the temperature of the process tube 13, which may be at as much as 1250° C.

Figure 10D:
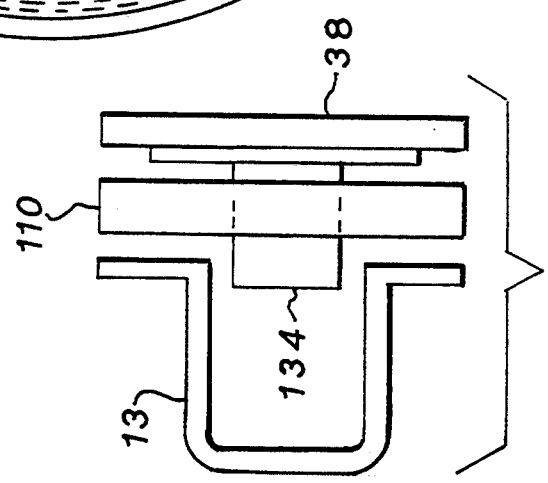

Carbide is a material which has enough strength to support the process tube 13 and support the load door 38 coming up on the bottom, as shown in FIG. 10D.

In order to get the flow characteristics, it is desirable to keep the flow coming down the edge of the process tube 13. There is at one point an exhaust hole 120 through the annular ring 110, and that connects in FIG. 11, so there is a hard connection with the O-ring connecting the little flange 122 to the annular ring 110, and that flange connects to a reducer 124 and goes over to an exhaust valve 126 (Teflon coated).

That gives a hard seal, but if that were done, it would be necessary to have the exhaust out of one side of the tube, and there would not be uniform flow throughout.

In normal operation, there is a quartz ring 128 which rests on one side of the V (FIG. 10C). Essentially, a channel 130 is created out of the quartz ring 128 and the silicon carbide ring 110. The quartz ring 128 then has perforations 132 in it periodically, so that the V-groove becomes like an exhaust plenum for the system. The gas flow comes down radially, goes out through the channels which are in the quartz cylinder and then that is the draw of the exhaust, and is distributed all the way around the tube, so there is uniform draw down there.

On the top side, there is now a quartz to silicon carbide seal with a hard seal, which is cooled. There is still the problem of getting the load door 38 to support the load. To do that, an insulating plug 134 is put in a top hat shape. The brim of that top hat shape mates to the O-ring in the lower side of the annular silicon carbide ring, so there is a hard seal there, as shown in FIG. 10D.

Now the top is sealed to the tube, the bottom sealed to the plug, but then underneath the plug there is the stainless steel door 38, so it can readily support the weight, and have no problem of further dropping the load, which is a key aspect.

For the ring 110, a number of materials, such as silicon carbide, and polysilicon would work. They both have to keep an O-ring cool and sufficient spring and sufficient thermal conductivity and strength to withstand the static temperature gradient, but the other concern is that when the load is pulled down, there is thermal shock potential, and there are problems with silicon carbide rupturing due to thermal shock, and if the ring were made out of solid silicon carbide, it might not work, because it would not have enough thermal conductivity.

The ring 110 is made out of graphite, and then it has a CVD coating of silicon carbide. The graphite itself could be a fine material in terms of its resistance of HCL and TCA attack. However, graphite would make a good fuel in the presence of oxygen, which is what this process is going to be charged with. So pure graphite is not used, because it is a great material to use in a machine and very high thermal conductivity, but it would not stand the presence of oxygen at high temperature, which would literally turn to $CO_2$.

A CVD coating of silicon carbide is given to the graphite, and that combination will resist thermal shock and keep the O-ring sufficiently cool.

Another candidate is polysilicon, which should also work. It does have sufficient strength and sufficient conductivity.

FIG. 12A gives another view of the ring 110 and the connection to the expansion pipe 136, and then finally the valve. Items 114 in FIG. 12A are the water jacket.

Surrounding that whole assembly to support the silicon carbide assembly 110 and the water jacket 114 is another stainless steel ring 138, and that stainless steel ring is bolted up to the support plate 140. That way the problems associated with trying to bolt to silicon carbide coated graphite are avoided, which is not a suitable material for holding a boat. The whole thing is wrapped and then, as FIG. 12B shows, the water lines 114 come in, wrap around and exit. There is an upper set and a lower set 114, entrance and exit, shown in FIG. 12B.

FIGS. 13A–C show details of the exhaust tube 122. It is a long narrow exhaust where it is desired to keep the cross-sectional area as high as possible to get the conductance of that exhaust tube 122 the same as the larger exhaust tube later on, where is currently two inches. That can be adjusted as necessary. There is an O-ring at the mating surface between the annular ring and the exhaust, and then an O-ring can be placed at the connection between the exhaust and the mating parts to go to the expansion to a two or three inch pipe.

The foregoing description of the preferred embodiment of the invention has been presented for purposes of illustration and description. It is not intended to be exhaustive or to limit the invention to the precise form disclosed, and many modifications and variations are possible in light of the above teaching. The preferred embodiment was chosen and described in order to best explain the principles of the invention and its practical applications to thereby enable others skilled in the art to best utilize the invention and various embodiments and with various modifications as are suited to the particular use contemplated. It is intended that the scope of the invention be defined only by the claims appended hereto.

What is claimed is:

1. An advanced vertical thermal reactor system comprising:
 a wafer handling chamber into which semiconductor wafers are placed into the reactor system for processing and from which wafers are removed from the reactor system;
 a process chamber for processing wafers received from said wafer handling chamber, and including a non-metallic ring sealingly coupled around an opening of said process chamber, a load door movable with respect to said ring, and a non-metallic plug which sealingly engages said ring when said door is moved adjacent to said ring; and
 a cool down chamber in which processed wafers from said process chamber cool down;
wherein each of said chambers is sealed from one another.

2. A system as in claim 1 wherein said non-metallic media includes a silicon carbide ring.

3. A system as in claim 2 wherein said ring is made of graphite and having a chemical vapor deposition (CVD) of silicon carbide.

4. A system as in claim 1 wherein said non-metallic media includes polysilicon.

5. A vertical thermal reactor system comprising:
 a wafer handling chamber into which semiconductor wafers are placed into the reactor system for processing and from which processed wafers are removed from the reactor system;
 a process chamber for processing wafers received from said wafer handling chamber, and having a vertical process tube with an open end;
 means for sealing the open end of the process tube and including a non-metallic ring sealingly coupled to the process tube, a load door movable with respect to said ring, and a non-metallic plug on said load door with said plug sealingly engaging said ring when said load door is moved adjacent to said ring;
 a first passageway between said process chamber and said wafer handling chamber, with a first door for sealing said first passageway;
 a cool down chamber in which processed wafers from said process chamber cool down; and
 a second passageway between said cool down chamber and said process chamber.

6. The reactor system as recited in claim 5 further comprising means for moving wafers among said handling chamber, said process chamber and said cool down chamber.

7. The reactor system as recited in claim 5 wherein said process tube is part of a furnace within which the wafers are processed.

8. The reactor system as recited in claim 5 wherein said non-metallic ring has an interior channel, a plurality of apertures through an inner wall of said ring, and an exhaust hole through an outer wall of said ring.

9. The reactor system as recited in claim 8 further comprising a exhaust tube assembly connected to the ring at the exhaust hole.

10. The reactor system as recited in claim 5 wherein said ring is made of silicon carbide.

11. The reactor system as recited in claim 10 wherein said ring is made of graphite with a chemical vapor deposition of silicon carbide.

12. The reactor system as recited in claim 5 wherein the non-metallic material includes polysilicon.

* * * * *